United States Patent
Chen et al.

(10) Patent No.: US 12,113,480 B2
(45) Date of Patent: Oct. 8, 2024

(54) CRYSTAL OSCILLATOR AND METHOD FOR PERFORMING STARTUP OF CRYSTAL OSCILLATOR

(71) Applicant: MEDIATEK INC., Hsin-Chu (TW)

(72) Inventors: Chien-Wei Chen, Hsinchu (TW); Chao-Ching Hung, Hsinchu (TW); Yu-Li Hsueh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 18/113,623

(22) Filed: Feb. 24, 2023

(65) Prior Publication Data

US 2024/0030872 A1 Jan. 25, 2024

Related U.S. Application Data

(60) Provisional application No. 63/368,999, filed on Jul. 21, 2022.

(51) Int. Cl.
| | | |
|---|---|---|
| *H03B 5/36* | (2006.01) | |
| *H03B 5/04* | (2006.01) | |
| *H03B 5/12* | (2006.01) | |

(52) U.S. Cl.
CPC ............. *H03B 5/366* (2013.01); *H03B 5/04* (2013.01); *H03B 5/1265* (2013.01); *H03B 2200/0094* (2013.01)

(58) Field of Classification Search
CPC ........ H03B 5/366; H03B 5/04; H03B 5/1265; H03B 2200/0094; H03L 7/02; H03L 3/00

(Continued)

(56) References Cited

U.S. PATENT DOCUMENTS 6,977,557 B1* 12/2005 Frerking ................... H03L 7/24
331/172
10,998,856 B1* 5/2021 Fang ........................ H03B 5/06
(Continued)

FOREIGN PATENT DOCUMENTS

WO 2015/091141 A1 6/2015
WO 2016/130255 A1 8/2016

OTHER PUBLICATIONS

Karim M. Megawer, Nilanjan Pal, Ahmed Elkholy, Mostafa G. Ahmed, Amr Khashaba, Danielle Griffith, Pavan Kumar Hanumolu, 54MHz Crystal Oscillator with 30× Start-Up Time Reduction Using 2-Step Injection in 65nm CMOS, ISSCC, 2019, IEEE, USA.

*Primary Examiner* — Arnold M Kinkead
(74) *Attorney, Agent, or Firm* — Winston Hsu

(57) ABSTRACT

A crystal oscillator (XO) and a method for performing startup of the XO are provided. The XO includes a XO core circuit, an auxiliary oscillator and a frequency detection circuit, wherein the frequency detection circuit includes a resistive circuit. The frequency detection circuit generates a detection voltage according to a driving signal associated with an auxiliary signal generated by the auxiliary oscillator and a first impedance of the resistive circuit. During a first powered on phase, the auxiliary oscillator is calibrated by utilizing the XO core circuit as a reference after startup of the XO core circuit is completed, and the resistive circuit is calibrated according to the detection voltage. During a second powered on phase, a frequency of the driving signal is calibrated according to the detection voltage, and the driving signal is injected to the XO core circuit for accelerating the startup of the XO core circuit.

20 Claims, 7 Drawing Sheets

(58) Field of Classification Search
USPC .......................................... 331/158, 57, 2, 46
See application file for complete search history.

(56) References Cited

U.S. PATENT DOCUMENTS

| | | |
|---|---|---|
| 11,387,781 B1 | 7/2022 | Chang |
| 2015/0372665 A1* | 12/2015 | Tohidian .............. H03K 3/0315 331/57 |
| 2020/0099337 A1 | 3/2020 | Powell |

* cited by examiner

CRYSTAL OSCILLATOR AND METHOD FOR PERFORMING STARTUP OF CRYSTAL OSCILLATOR

CROSS REFERENCE TO RELATED APPLICATIONS

This application claims the benefit of U.S. Provisional Application No. 63/368,999, filed on Jul. 21, 2022. The content of the application is incorporated herein by reference.

BACKGROUND

The present invention is related to crystal oscillators (XOs), and more particularly, to a XO and a method for performing startup of a XO.

For future communications application (e.g., a duty-cycled wireless/wired system), operations of a duty-cycled wireless/wired system may include three modes such as a sleep mode, a wakeup mode and a listen mode. When the system is operating in the sleep mode, a crystal oscillator (XO) therein (e.g., oscillation of the XO) can be disabled in order to save power. The system may enter the wakeup mode in order to perform startup of the XO. When oscillation of the XO turns into a steady state (e.g., an output swing of the XO reaches a predetermined level), the system may enter the listen mode in order to detect whether there is any data to be sent or received. If the speed of the startup of the XO can be improved, a time period of the system operating in the wakeup mode can be reduced, thereby reducing overall power consumption of the system.

Some fast startup methods are proposed in related arts. Some disadvantages exist in the related art, however. For example, temperature variation may impact a time length of startup of the XO, where the related arts may adopt passive devices such as inductors that are less sensitive to the temperature variation for implementing some startup related circuits, in order to make the requirement of the temperature variation as simple as possible. However, utilizing such devices may greatly increase an overall circuit area in practice.

Thus, there is a need for a novel architecture of a fast startup XO and a related fast startup method, in order to ensure that performance (e.g., speed) of startup of a XO can be less sensitive to temperature variation.

SUMMARY

An objective of the present invention is to provide a crystal oscillator (XO) and a method for performing startup of a XO, which can ensure that a fast startup technique adopted in the XO can properly work under temperature variation.

At least one embodiment of the present invention provides a XO. The XO comprises a XO core circuit, an auxiliary oscillator and a frequency detection circuit, wherein the frequency detection circuit comprises a resistive circuit. The XO core circuit is configured to generate a XO signal. The auxiliary oscillator is configured to generate an auxiliary signal. The frequency detection circuit is configured to generate a detection voltage according to a driving signal associated with the auxiliary signal and a first impedance of the resistive circuit. During a first phase of the XO, the auxiliary oscillator is calibrated by utilizing the XO signal as a reference signal, and the resistive circuit is calibrated by controlling the first impedance to make the detection voltage approach a reference voltage. During a second phase of the XO, the auxiliary oscillator is calibrated to make a frequency of the driving signal to be a driving frequency which makes the detection voltage approach the reference voltage, and the driving signal having the driving frequency is injected to the XO core circuit for accelerating the startup of the XO core circuit.

At least one embodiment of the present invention provides a method for performing startup of a XO. The method comprises: utilizing a XO core circuit of the XO to generate a XO signal; utilizing an auxiliary oscillator of the XO to generate an auxiliary signal; utilizing a frequency detection circuit to generate a detection voltage according to a driving signal associated with the auxiliary signal and a first impedance of the resistive circuit within the frequency detection circuit; during a first phase of the XO, calibrating the auxiliary oscillator by utilizing the XO signal as a reference signal; during the first phase, calibrating the resistive circuit by controlling the first impedance to make the detection voltage approach a reference voltage; during a second phase of the XO, calibrating the auxiliary oscillator to make a frequency of the driving signal to be a driving frequency which makes the detection voltage approach the reference voltage; and injecting the driving signal having the driving frequency to the XO core circuit for accelerating the startup of the XO core circuit.

The XO and the method provided by the embodiment of the present invention utilizes the frequency detection circuit as a reference for calibrating the auxiliary oscillator during the second phase, thereby ensuring that a frequency error between the driving signal and the XO signal falls in an allowable range even if the temperature varies. Thus, time for the startup of the XO core circuit during the second phase can be greatly reduced by injecting the driving signal to the XO core circuit. In addition, as the auxiliary oscillator can be implemented with small sized circuits such as ring oscillators, the circuit area will not be greatly increased.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
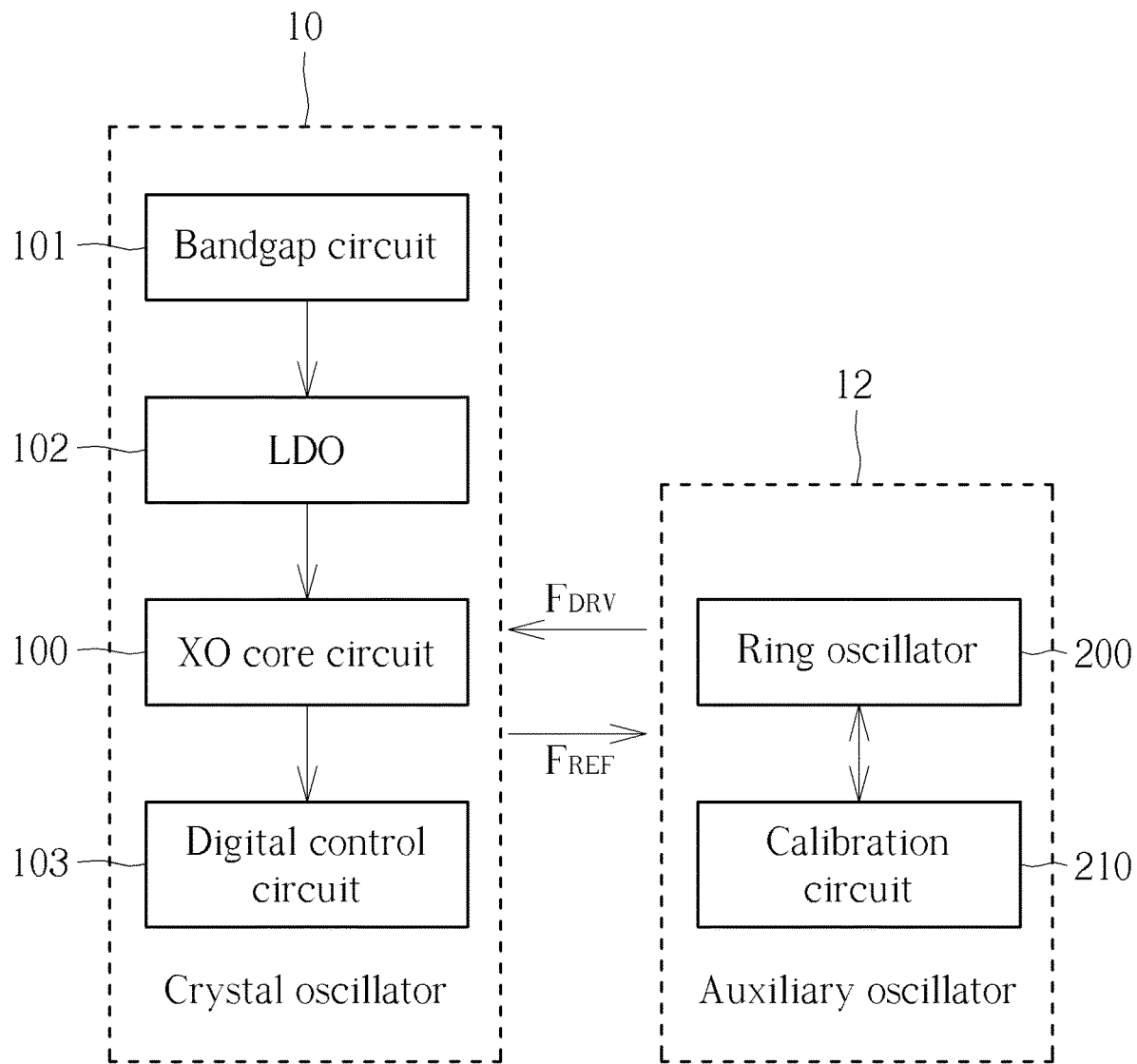
FIG. 1 is a diagram illustrating startup of a crystal oscillator with aid of an auxiliary oscillator according to an embodiment of the present invention.

FIG. 1 is a diagram illustrating startup of a crystal oscillator (XO) 10 with aid of an auxiliary oscillator 12 according to an embodiment of the present invention. As shown in FIG. 1, the crystal oscillator 10 may comprise a XO core circuit 100, a bandgap circuit 101, a low dropout regulator (LDO) 102 and a digital control circuit 103. When controlling the XO 10 to enter a wakeup mode from a sleep mode for eventually entering a listen mode, if there is no external oscillation source injecting initial energy to the XO core circuit 100, the crystal oscillator 10 will takes a few milliseconds (ms) for accumulating energy on a crystal resonator of the XO core circuit 100 by intrinsic oscillation only, in order to makes an output swing of a XO signal $F_{REF}$ grow to an available level. Thus, an auxiliary oscillator 12 which has a lower quality factor but a higher startup speed can be configured to inject energy to the XO core circuit 100 by transmitting a driving signal $F_{DRV}$ to the XO core circuit 100, in order to accelerate startup of the XO core circuit 100.

It should be noted that different relative phases (e.g. phase error) between the driving signal $F_{DRV}$ and the XO signal $F_{REF}$ may result in different patterns of growth of the XO signal $F_{REF}$, and more particularly, when a frequency of the driving signal $F_{DRV}$ is different from a frequency of the XO signal $F_{REF}$, a beating behavior shows up, which means a growth rate of a voltage swing of the XO signal $F_{REF}$ is not always positive. For example, when a frequency error $\Delta f$ between the driving signal $F_{DRV}$ and the XO signal $F_{REF}$ is 10000 parts per million (ppm), the startup of the XO core circuit 100 may operate in a positive growth rate for 1.25 microseconds (μs). When the frequency error $\Delta f$ between the driving signal $F_{DRV}$ and the XO signal $F_{REF}$ is 100 ppm, the startup of the XO core circuit 100 may operate in a positive growth rate for 125 μs. Thus, an time period of external signal injection that is capable of accelerating the startup of the XO core circuit depends on the frequency error $\Delta f$. In practice, 1 μs of the external signal injection may be required to ensure that the XO signal $F_{REF}$ can grow to an acceptable level, which makes subsequent steps of the startup be properly executed.

In practice, the XO 10 may be periodically switched among the sleep mode, the wakeup mode and the listen mode. Even though the frequency of the $F_{DRV}$ output from the auxiliary oscillator 12 may be calibrated to make the frequency error $\Delta f$ less than a predetermined threshold when the XO 10 is first time powered on (e.g. when an electronic device such as a wireless/wired system is powered on), temperature of the electronic device may vary as time goes by, resulting the frequency error $\Delta f$ exceeding an allowable range.

In order to prevent frequency error $\Delta f$ introduced by temperature variation from impacting the performance of the fast startup mechanism, the auxiliary oscillator 12 in some embodiments may be implemented with an inductor-capacitor (LC) oscillator, which is less sensitive to the temperature variation as inductors and capacitors inherently have smaller temperature coefficients in comparison with active loads such as transistors. The inductors and the capacitors require larger area in comparison with the active devices, however. Thus, the LC oscillator may be shared by the auxiliary oscillator 12 and an existing frequency synthesizer within the system, instead of utilizing a dedicated LC oscillator configured for the startup of the XO 10. In practice, the XO 10 typically has its own power management circuit (e.g. the bandgap circuit 101 and the LDO) and associated digital control such as the digital control circuit 103, and the frequency synthesizer (e.g. the shared LC oscillator therein) has its own power management circuit and associated digital control. When performing the startup of the XO 10 with aid of the shared LC oscillator, the XO signal $F_{REF}$, the driving signal $F_{DRV}$, reference related signals (e.g. bandgap currents) and associated digital control signals need to be transmitted between the XO 10 and the frequency synthesizer, but the XO 10 and the frequency synthesizer are typically far from each other in practice (e.g. about 2000 micrometers apart), making the routing and associated multiplexer control complicated.

For a purpose of simplifying the design, it is preferable to utilize a dedicated oscillator for implementing the auxiliary oscillator 12. In this embodiment, the auxiliary oscillator 12 may comprise a ring oscillator 200 which is much smaller than the LC oscillator. As the ring oscillator 200 is much more sensitive to the temperature variation, the auxiliary oscillator 12 may further comprise a calibration circuit 210 configured to calibrate the auxiliary oscillator 12 in response to the frequency error $\Delta f$ introduced by process variation and temperature variation. As the auxiliary oscillator 12 (e.g. the ring oscillator 200) is dedicated for the startup of the XO 10, instead of being shared with other functional blocks, the auxiliary oscillator 12 can be physically close to the XO (e.g. about 100 micrometers apart), and the routing can be greatly simplified in comparison with utilizing a shared LC oscillator.

Figure 2:
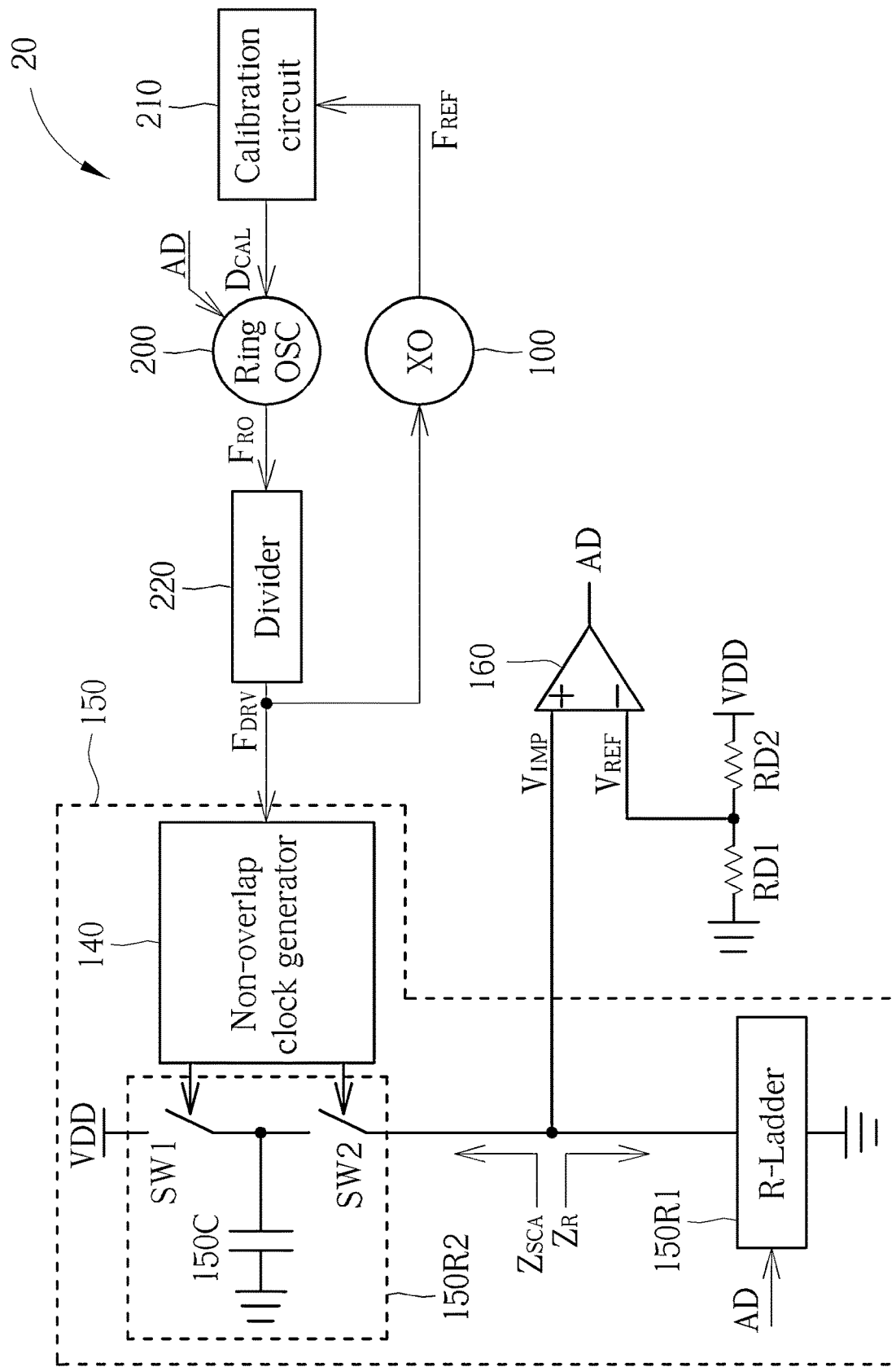
FIG. 2 is a diagram illustrating a fast startup crystal oscillator according to an embodiment of the present invention.

FIG. 2 is a diagram illustrating a fast startup XO 20 according to an embodiment of the present invention. As shown in FIG. 2, the fast startup XO 20 may comprise a XO core circuit such as the XO core circuit 100 (labeled "XO" in FIG. 2 for brevity), an auxiliary oscillator such as the ring oscillator 200, and a frequency detection circuit 150. The XO core circuit 100 is configured to generate the XO signal $F_{REF}$, and the ring oscillator is configured to generate an auxiliary signal $F_{RO}$. In this embodiment, the fast startup XO 20 may further comprise an interfacing circuit coupled to the XO core circuit 100, the ring oscillator 200 and the frequency detection circuit 150, where the interfacing circuit is configured to generate the driving signal $F_{DRV}$ according to the auxiliary signal $F_{RO}$. The interfacing circuit is preferable to be implemented with a divider 220, but the present invention is not limited thereto. In this embodiment, the divider 220 is configured to perform frequency division on the auxiliary signal $F_{RO}$ to generate the driving signal $F_{DRV}$. Thus, when the calibration circuit 210 utilizes the XO signal $F_{REF}$ as a reference signal for calibrating the ring oscillator 200 by controlling a calibration code $D_{CAL}$, related calibration flows can be executed at a frequency of the auxiliary signal $F_{RO}$, thereby improving efficiency of calibration of the ring oscillator 200, but the present invention is not limited thereto.

In this embodiment, the frequency detection circuit 150 comprises a resistive circuit such as a resistor ladder 150R1 (labeled "R-Ladder" in FIG. 2 for brevity). The frequency detection circuit 150 is configured to generate a detection voltage $V_{IMP}$ according to the driving signal $F_{DRV}$ associated with the auxiliary signal $F_{RO}$ and a first impedance $Z_R$ of the resistive circuit such as the resistor ladder 150R1. During a first powered on phase of the fast startup XO 20, the ring oscillator 200 is calibrated by utilizing the XO signal $F_{REF}$ as a reference signal after startup of the XO core circuit 100 is completed, and the resistor ladder 150R1 is calibrated by controlling the first impedance $Z_R$ to make the detection voltage $V_{IMP}$ approach a reference voltage $V_{REF}$. During a second powered on phase of the fast startup XO 20 after the first power on phase, the ring oscillator 200 is calibrated to make a frequency of the driving signal $F_{DRV}$ to be a driving frequency which makes the detection voltage $V_{IMP}$ approach the reference voltage $V_{REF}$, and the driving signal $F_{DRV}$ having the driving frequency can be injected to the XO core circuit 100 for accelerating the startup of the XO core circuit 100.

In this embodiment, the frequency detection circuit 150 may further comprise a switched-capacitor resistor 150R2, where the switched-capacitor resistor 150R2 is configured to provide a second impedance $Z_{SCA}$ according to the frequency of the driving signal $F_{DRV}$. The frequency detection circuit 150 may generate the detection voltage $V_{IMP}$ according to the first impedance $Z_R$ of the resistor ladder 150R1 and the second impedance $Z_{SCA}$ of the switched-capacitor resistor 150R2. In detail, the switched-capacitor resistor 150R2 may comprise a capacitor 150C, switches SW1 and SW2, and a non-overlap clock generator 140. The capacitor 150C has a first end coupled to a first reference terminal such as a supply voltage VDD. The switch SW1 is coupled between a second reference terminal such as a ground voltage and a second end of the capacitor 150C. The switch SW2 is coupled between the second end of the capacitor 150C and the R-ladder 150R1. The non-overlap clock generator 140 may generate two control signals according to the driving signal $F_{DRV}$, and the switches SW1 and SW2 are respectively controlled by the two control signals, where the two control signals non-overlap each other. According to control of the switches SW1 and SW2, the second impedance $Z_{SCA}$ of the switched capacitor resistor 150R2 may be $(1/(f_{OSC} \times C))$, where $f_{OSC}$ may represent the frequency of the driving signal $F_{DRV}$, and C may represent a capacitance of the capacitor 150C. In this embodiment, the reference voltage $V_{REF}$ may be generated according to a ratio of a resistance of a resistor RD1 to a resistance of a resistor RD2. Assuming that the resistance of the resistor RD1 is equal to the resistance of the resistor RD2, when the frequency $f_{OSC}$ is equal to $(1/(Z_R \times C))$, the detection voltage $V_{IMP}$ may be equal to the reference voltage $V_{REF}$. The fast startup XO 20 may further comprise a comparator, where the comparator 160 is configured to compare the detection voltage $V_{IMP}$ with the reference voltage $V_{REF}$ to generate a comparison result AD, and the fast startup XO 20 may calibrate the first impedance $Z_R$ and the frequency $f_{OSC}$ according to the comparison result AD. For example, the comparator 160 may utilize a first input terminal (which is labeled "+" in figures) to receive the detection voltage $V_{IMP}$ and utilize a second input terminal (which is labeled "−" in figures) to receive the reference voltage $V_{REF}$. Related details will be described in the following paragraphs.

Figure 3:
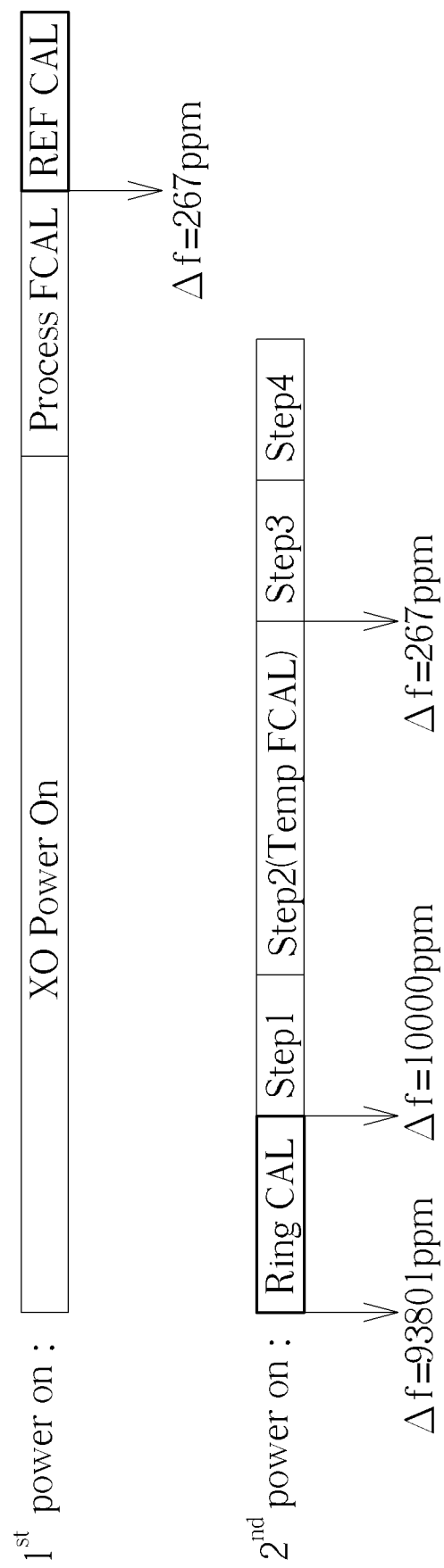
FIG. 3 is a diagram illustrating operations of a fast startup crystal oscillator during a first powered on phase and a second powered on phase according to an embodiment of the present invention.

FIG. 3 is a diagram illustrating operations of the fast startup XO 20 during the first powered on phase and the second powered on phase according to an embodiment of the present invention, where the first powered on phase is labeled "$1^{st}$ power on" in FIG. 3, and the second powered on phase is labeled "$2^{nd}$ power on" in FIG. 3. In specific, the first powered on phase may represent a condition where a system comprising the fast startup XO 20 is powered on (e.g. powered on by a user). The second powered on phase may represent a condition where the fast startup XO 20 enters the wakeup mode from the sleep mode, where the system comprising the fast startup XO 20 is already active. The present invention is aimed at improving the startup of the fast startup XO 20 during the second powered phase.

During the first powered on phase, as the frequency error Δf may exceed the allowable range due to process variation and temperature variation, the startup of the XO core circuit 100 is performed without injecting the driving signal $F_{DRV}$ to the XO core circuit 100, and is performed with intrinsic oscillation only, therefore taking a longer time to make the output swing of the XO core circuit 100 reaches the available level as illustrated by the bar labeled "XO power on". After the startup of the XO core circuit 100 is completed, the calibration circuit 210 may calibrate the ring oscillator 200 by utilizing the XO signal F REF as the reference signal, to generate the calibration code $D_{CAL}$ which controlling the frequency of the auxiliary signal $F_{RO}$, thereby controlling the frequency of the driving signal $F_{DRV}$ to approach the frequency of the XO signal $F_{REF}$ as illustrated by the bar labeled "Process FCAL". After the calibration of the ring oscillator 200 is completed, the frequency error Δf can be greatly reduced such as reduced to 267 ppm (which means the frequency of the driving signal $F_{DRV}$ is sufficiently close to the frequency of the XO signal $F_{REF}$), and the fast startup XO 20 may calibrate the resistive circuit such as the resistor ladder 150R1 by controlling the first impedance $Z_R$ to make the detection voltage $V_{IMP}$ approach the reference voltage $V_{REF}$ as illustrated by the bar labeled "REF CAL". For example, the fast startup XO 20 may calibrate the resistor ladder 150R1 by utilizing the driving signal $F_{DRV}$ as a reference signal, and control the first impedance $Z_R$ of the resistor ladder (e.g. controlling switches within the resistor ladder 150R1) according to the comparison result AD. In specific, as the frequency $f_{OSC}$ of driving signal $F_{DRV}$ is correct (e.g. sufficiently close to the frequency of the XO signal $F_{REF}$) after the calibration of the ring oscillator 200 is completed, the comparison result AD indicating whether the detection voltage $V_{IMP}$ is greater or less than the reference voltage $V_{REF}$ may also indicate whether the first impedance $Z_R$ needs to be increased or reduced, but the present invention is not limited thereto.

During the second powered on phase after the first powered on phase, the frequency error Δf may exceed the allowable range again, e.g. Δf=93801 ppm, as the temperature is different from that during the first powered on phase. The fast startup XO 20 may calibrate the ring oscillator 200 to make the frequency of the driving signal $F_{DRV}$ to be a driving frequency which makes the detection voltage $V_{IMP}$ approach the reference voltage $V_{REF}$ as illustrated by the bar labeled "Ring CAL". For example, the fast startup XO 20 may calibrate the ring oscillator 200 (e.g. calibrate the frequency of the driving signal $F_{DRV}$ by utilizing the first impedance $Z_R$ of the resistor ladder 150R1 as a reference) according to the comparison result AD. Even though the first impedance $Z_R$ of the resistor ladder 150R1 may vary in response to the temperature variation, temperature coefficients of resistors are typically small enough to ensure that the frequency error Δf can be reduced to 10000 ppm or less than 10000 ppm after the calibration of the ring oscillator 200 is completed. In addition, mismatch of the temperature coefficients of resistors are typically ignorable. In specific, as the first impedance $Z_R$ of the resistor ladder 150R1 has been calibrated and the temperature coefficient of the resistor ladder 150R1 is small enough to be ignored, the comparison result AD indicating whether the detection voltage VIMP is greater or less than the reference voltage $V_{REF}$ may also indicate whether the frequency $f_{OSC}$ of the driving signal $F_{DRV}$ (or the frequency of the auxiliary signal $F_{RO}$ generated by the ring oscillator 200) needs to be increases or reduced. After the calibration of the ring oscillator 200 by utilizing the resistor ladder 150R1 as a reference is completed, the subsequent startup operations properly can work. For example, the driving signal $F_{DRV}$ which has the driving frequency with the frequency error Δf not greater than 10000 ppm can be injected to the XO core circuit 100 for at least 1 μs as illustrated by the bar labeled "Step1" to make the swing of the XO signal F REF grows to the available level (e.g. available for being a reference signal) in order to accelerate the startup of the XO core circuit 100. Then, the calibration circuit 210 may calibrate the ring oscillator 200 by utilizing the XO signal $F_{REF}$ with the growth swing as the reference signal as illustrated by the bar labeled "Step2 (Temp FCAL)", in order to further reduce the frequency error Δf, e.g. reduced to 267 ppm. As the frequency error Δf is further reduced, the driving signal $F_{DRV}$ can be injected to the XO core circuit 100 with a higher frequency accuracy as illustrated by the bar labeled "Step 3". Finally, the swing of the XO signal F REF can grow to a predetermined level, and the path from the divider 220 to the XO core circuit 100 may be disabled as illustrated by the bar labeled "Step4", which means the startup of the fast startup XO 20 is completed.

It should be noted that as long as the frequency detection circuit 150 can generate the detection voltage $V_{IMP}$ at least according to the frequency $f_{OSC}$ of the driving signal $F_{DRV}$, detailed implementation of the frequency detection circuit 150 may be different from that shown in FIG. 2. For example, even though the resistor ladder 150R1 is coupled between the first input terminal of the comparator 160 and the ground voltage, and the switched capacitor resistor 150R2 is coupled between the first input terminal of the comparator 160 and the supply voltage VDD, but the present invention is not limited thereto.

Figure 4:
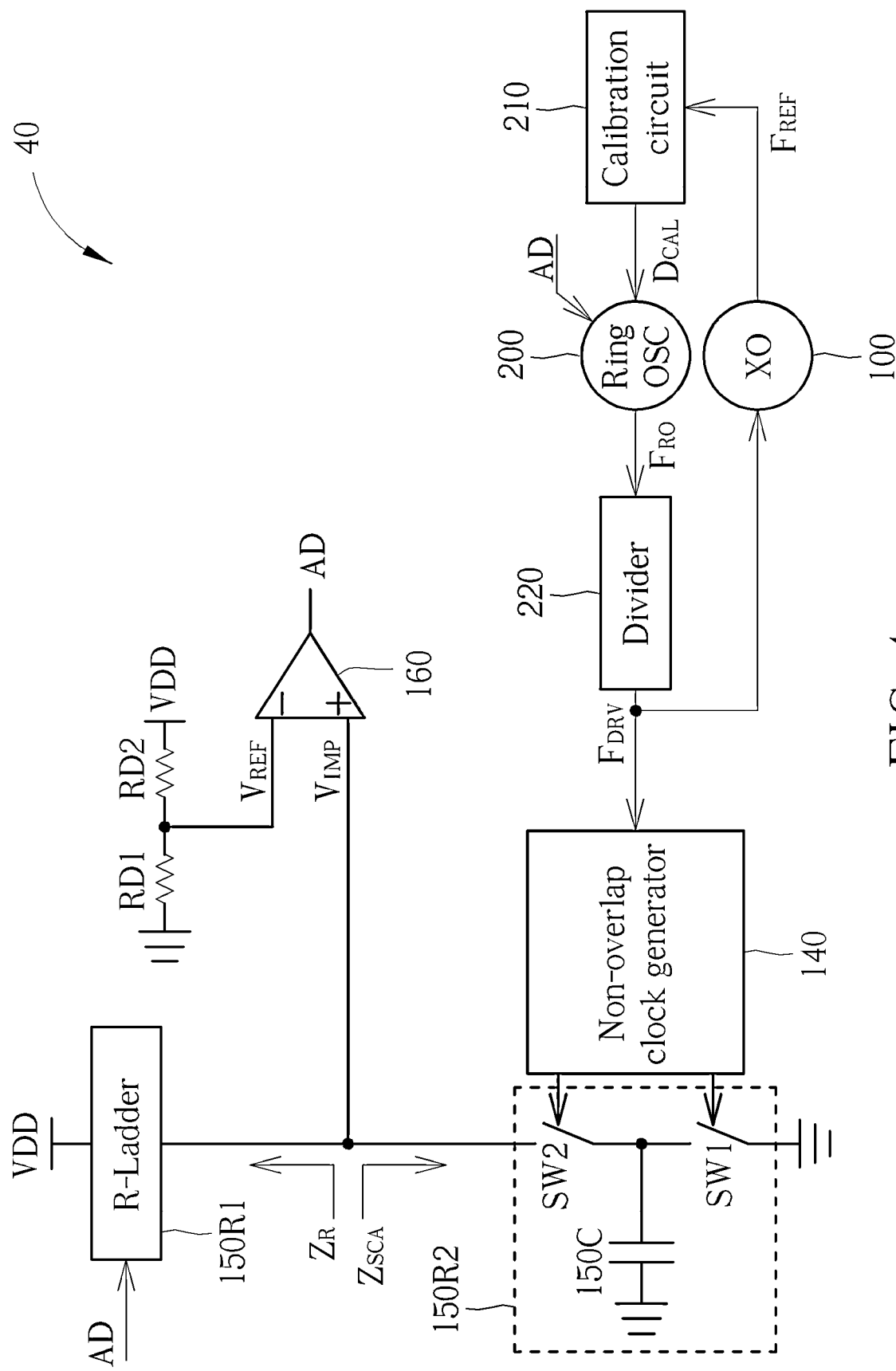
FIG. 4 is a diagram illustrating a fast startup crystal oscillator according to another embodiment of the present invention.

FIG. 4 is a diagram illustrating a fast startup XO 40 according to another embodiment of the present invention. As shown in FIG. 4, the resistor ladder 150R1 may be coupled between the first input terminal of the comparator 160 and the supply voltage VDD, and the switched capacitor resistor 150R2 may be coupled between the first input terminal of the comparator 160 and the ground voltage. The remaining blocks within the fast startup XO 40 are the same as the fast startup XO 20, related details are not repeated here for brevity.

Figure 5:
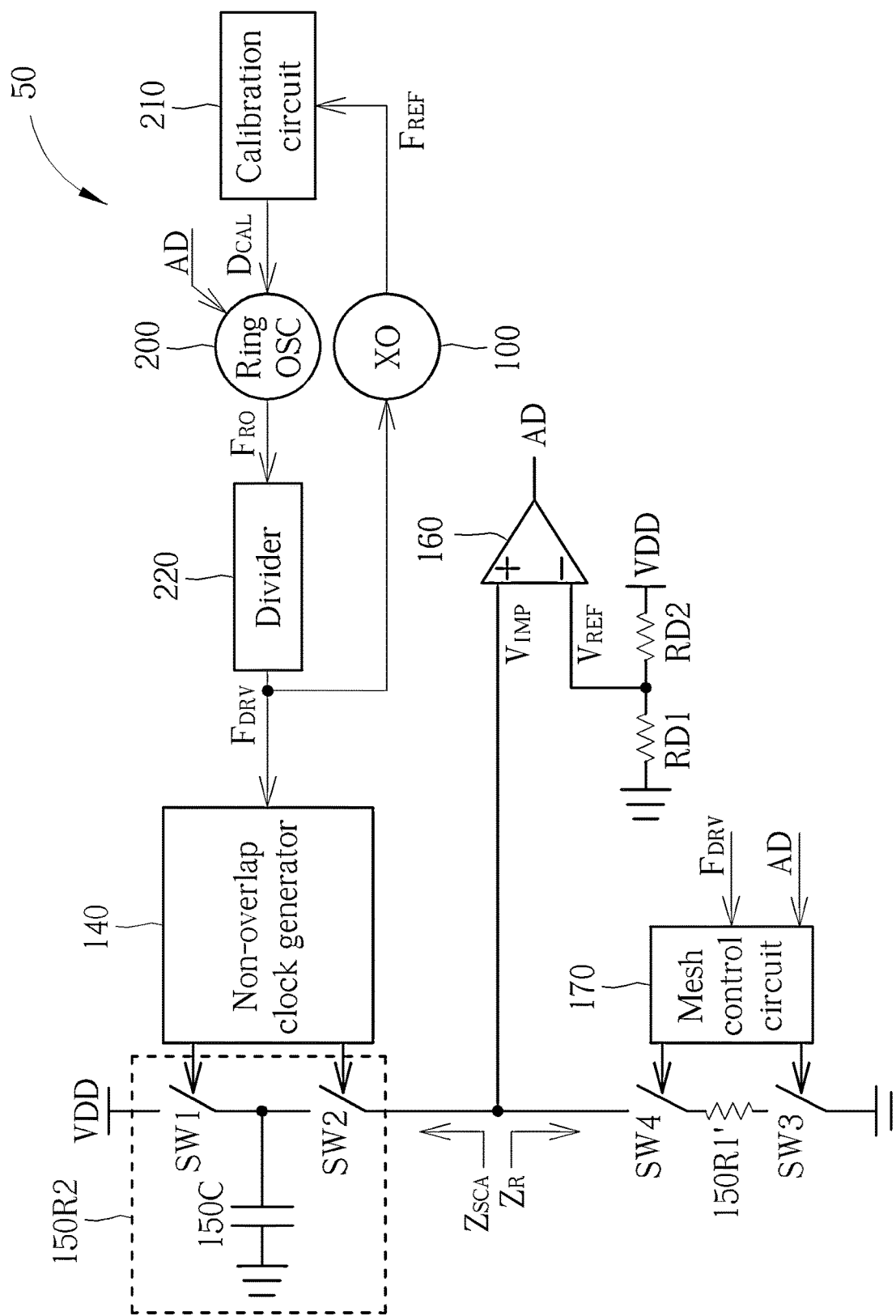
FIG. 5 is a diagram illustrating a fast startup crystal oscillator according to yet another embodiment of the present invention.

In addition, the resistive circuit does not have to be implemented by a resistor ladder. As long as the resistive circuit can provide the first impedance which is adjustable, alternative designs of the resistive circuit should belong to the scope of the present invention. As shown in FIG. 5, which is a diagram illustrating a fast startup XO 50 according to yet another embodiment of the present invention, the resistive circuit may be implemented with a resistor 150R1', switches SW3 and SW4, and a mesh control circuit 170. In this embodiment, the switch SW3 is coupled between one end of the resistor 150R1' and the ground voltage, and the switch SW4 is coupled between the resistor 150R1' the other end of the resistor 150R1' and the first input terminal of the comparator 160. The mesh control circuit 170 is coupled to the switches SW3 and SW4, where the mesh control circuit 170 is configured to generate at least one control signal to control a ratio of a time period of the switches SW3 and SW4 being turned on to a time period of the switches SW3 and SW4 being turned off, in order to determine the first impedance $Z_R$ of the resistive circuit. For example, a control signal for controlling the switch SW3 may be the same as a control signal for controlling the switch SW4, where during a first time period, both the switches SW3 and SW4 are turned on, and during a second time period, both the switches SW3 and SW4 are turned off. An equivalent value of the first impedance $Z_R$ can be determined according to a ratio of the first time period to the second time period. The remaining blocks within the fast startup XO 50 are the same as the fast startup XO 20, related details are not repeated here for brevity.

In some embodiment, one of the switches SW3 and SW4 may be omitted. For example, the switch SW3 may be omitted, where the resistor 150R1' may be coupled between the switch SW4 and the ground voltage. In another example, the switch SW4 may be omitted, where the resistor 150R1' may be coupled between the switch SW3 and the first input terminal of the comparator 160.

Figure 6:
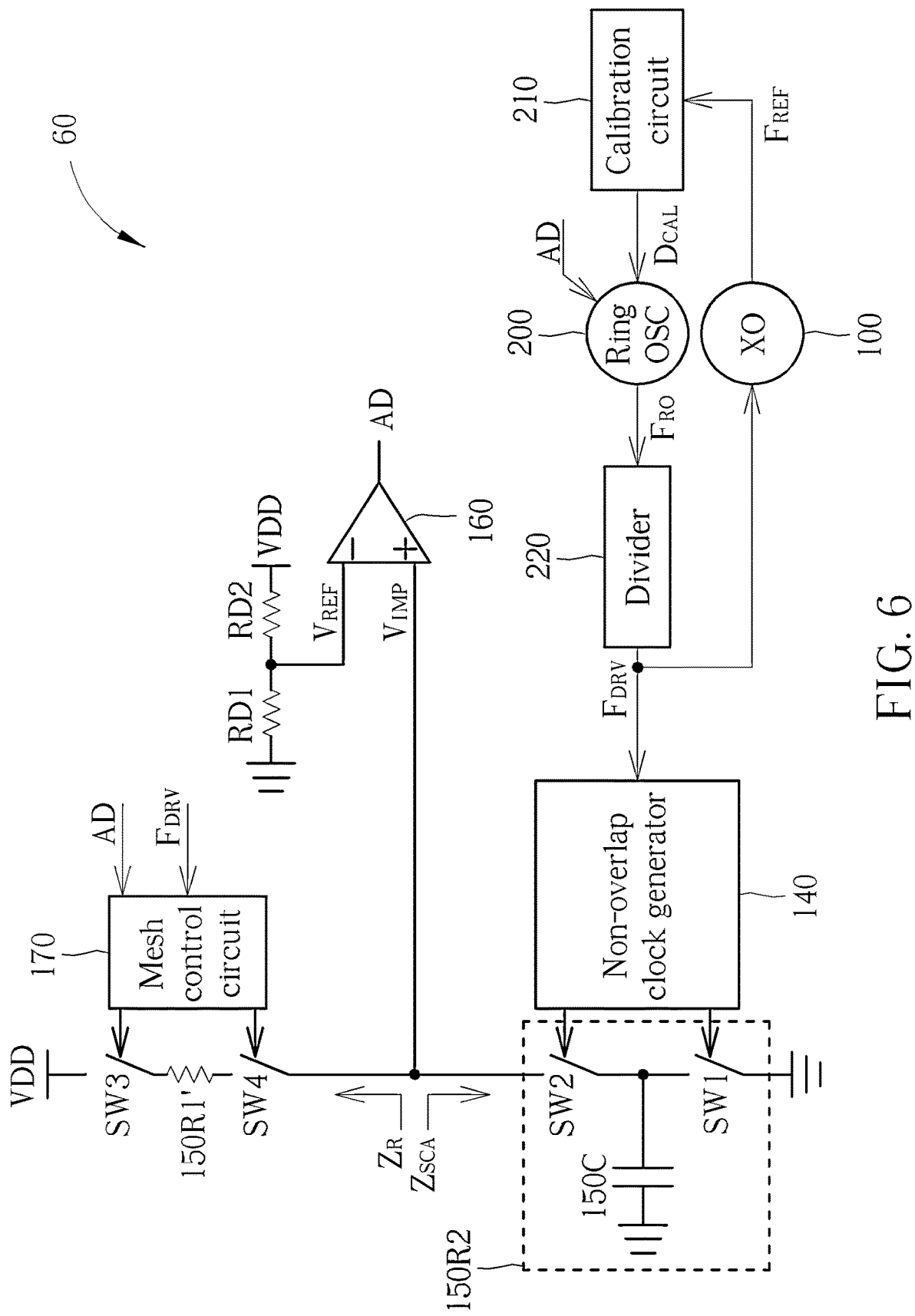
FIG. 6 is a diagram illustrating a fast startup crystal oscillator according to still another embodiment of the present invention.

FIG. 6 is a diagram illustrating a fast startup XO 60 according to still another embodiment of the present invention. As shown in FIG. 4, the resistive circuit implemented with the resistor 150R1', the switches SW3 and SW4, and the mesh control circuit 170 may be coupled between the first input terminal of the comparator 160 and the supply voltage VDD, and the switched capacitor resistor 150R2 may be coupled between the first input terminal of the comparator 160 and the ground voltage. The remaining blocks within the fast startup XO 60 are the same as the fast startup XO 20, related details are not repeated here for brevity.

Figure 7:
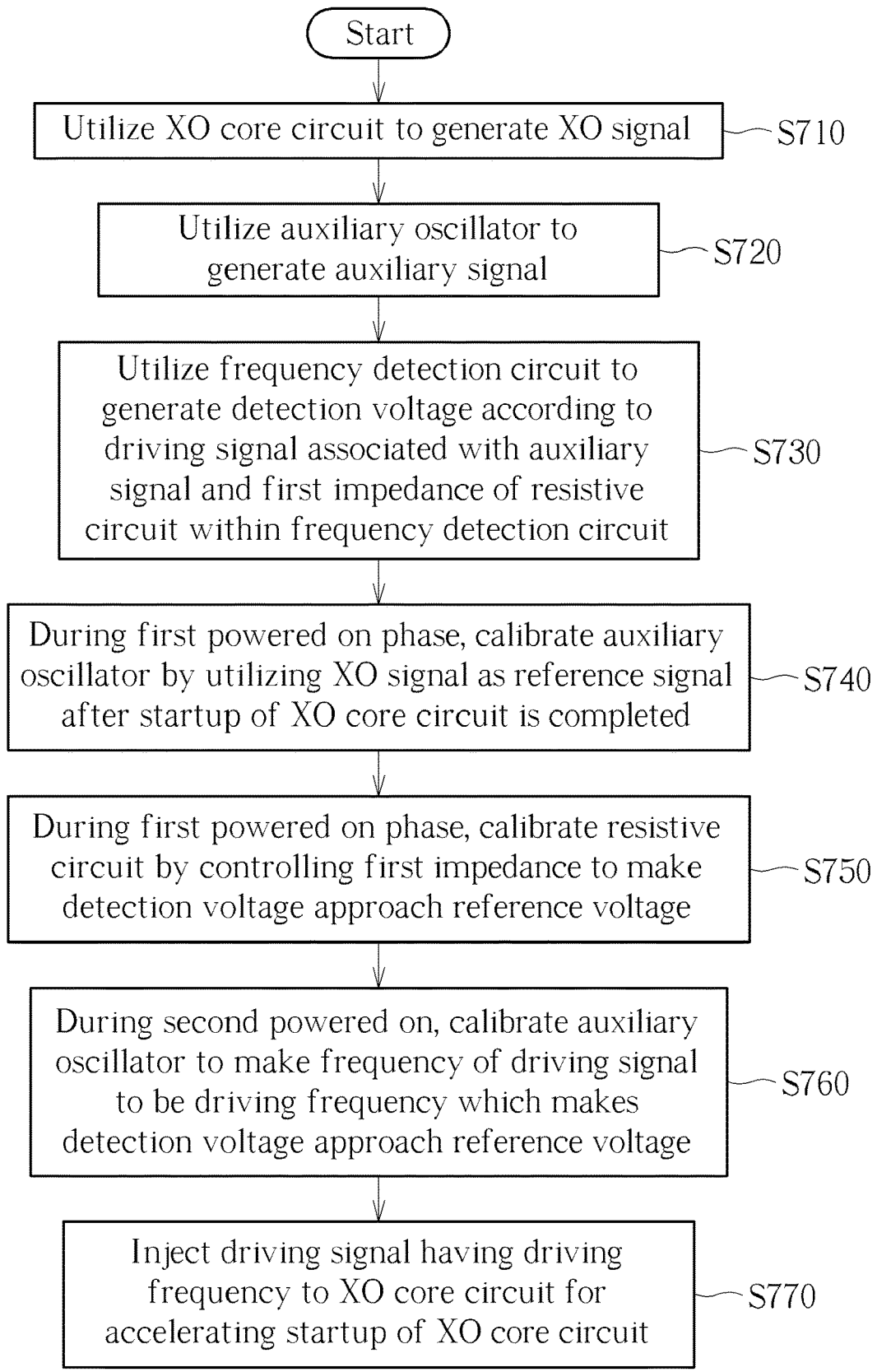
FIG. 7 is a diagram illustrating a working flow of a method for performing startup of a crystal oscillator according to an embodiment of the present invention.

FIG. 7 is a diagram illustrating a working flow of a method for performing startup of a XO (e.g. the fast startup XOs 20, 40, 50 and 60, and more particularly, the XO core circuit therein) according to an embodiment of the present invention. It should be noted that one or more steps may be added, deleted or modified in the working flow shown in FIG. 7. In addition, if an overall result is not hindered, these steps do not have to be executed in the exact order shown in FIG. 7.

In Step S710, the XO may utilize a XO core circuit thereof to generate a XO signal.

In Step S720, the XO may utilize an auxiliary oscillator thereof to generate an auxiliary signal.

In Step S730, the XO may utilize a frequency detection circuit to generate a detection voltage according to a driving signal associated with the auxiliary signal and a first impedance of the resistive circuit within the frequency detection circuit.

In Step S740, during a first powered on phase of the XO, the XO may calibrate the auxiliary oscillator by utilizing the XO signal as a reference signal after startup of the XO core circuit is completed.

In Step S750, during the first powered on phase, the XO may calibrate the resistive circuit by controlling the first impedance to make the detection voltage approach a reference voltage.

In Step S760, during a second powered on phase of the XO after the first power on phase, the XO may calibrate the auxiliary oscillator to make a frequency of the driving signal to be a driving frequency which makes the detection voltage approach the reference voltage.

In Step S770, the XO may inject the driving signal having the driving frequency to the XO core circuit for accelerating the startup of the XO core circuit.

To summarize, the fast startup XO and the associated method provided by the embodiments of the present invention calibrate the frequency detection circuit (more particularly, a resistive circuit therein) which is less sensitive to the temperature variation in comparison with the auxiliary oscillator during the first powered on phase, and then calibrate the auxiliary oscillator by utilizing the frequency detection circuit as a reference during the second powered on phase. Thus, the subsequent startup operations can be performed based on a condition where the frequency error is less than 10000 ppm, which allows the injection of the auxiliary signal to be performed at least 1 µs, ensuring that the swing of the XO signal can grow to the available level. In addition, the embodiments of the present invention will not greatly increase overall costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator (XO), comprising:
a XO core circuit, configured to generate a XO signal;
an auxiliary oscillator, configured to generate an auxiliary signal; and
a frequency detection circuit, comprising a resistive circuit, wherein the frequency detection circuit is configured to generate a detection voltage according to a driving signal associated with the auxiliary signal and a first impedance of the resistive circuit;
wherein:
during a first phase of the XO, the auxiliary oscillator is calibrated by utilizing the XO signal as a reference signal, and the resistive circuit is calibrated by controlling the first impedance to make the detection voltage approach a reference voltage according to a comparison result of the detection voltage and the reference voltage; and
during a second phase of the XO, the auxiliary oscillator is calibrated to make a frequency of the driving signal to be a driving frequency which makes the detection voltage approach the reference voltage according to the comparison result of the detection voltage and the reference voltage, and the driving signal having the driving frequency is injected to the XO core circuit for accelerating the startup of the XO core circuit.

2. The XO of claim 1, wherein the startup of the XO core circuit is performed without injecting the driving signal to the XO core circuit during the first phase.

3. The XO of claim 1, further comprising:
a comparator, configured to compare the detection voltage with the reference voltage to generate the comparison result.

4. The XO of claim 3, wherein the resistive circuit is calibrated by controlling the first impedance of the resistive circuit according to the comparison result during the first phase.

5. The XO of claim 3, wherein the auxiliary oscillator is calibrated according to the comparison result during the second phase.

6. The XO of claim 1, further comprising:
a divider, coupled to the XO core circuit, the auxiliary oscillator and the frequency detection circuit, configured to perform frequency division on the auxiliary signal to generate the driving signal.

7. The XO of claim 1, wherein the frequency detection circuit comprises:
a switched-capacitor resistor, configured to provide a second impedance according to the frequency of the driving signal;
wherein the frequency detection circuit generates the detection voltage according to the first impedance of the resistive circuit and the second impedance of the switched-capacitor resistor.

8. The XO of claim 7, wherein the switched-capacitor resistor comprises:
a capacitor, having a first end coupled to a first reference terminal;
a first switch, coupled between a second reference terminal and a second end of the capacitor; and
a second switch, coupled between the second end of the capacitor and the resistive circuit;
wherein the first switch and the second switch are respectively controlled by two control signals that non-overlap each other, and the two control signals are generated according to the driving signal.

9. The XO of claim 1, wherein the resistive circuit comprises a resistor ladder.

10. The XO of claim 1, wherein the resistive circuit comprises:
a resistor;
at least one switch, coupled to the resistor; and
a mesh control circuit, coupled to the at least one switch, configured to generate at least one control signal to control a ratio of a time period of the at least one switch being turned on to a time period of the at least one switch being turned off, in order to determine the first impedance of the resistive circuit.

11. A method for performing startup of a crystal oscillator (XO), comprising:
utilizing a XO core circuit of the XO to generate a XO signal;
utilizing an auxiliary oscillator of the XO to generate an auxiliary signal;
utilizing a frequency detection circuit to generate a detection voltage according to a driving signal associated with the auxiliary signal and a first impedance of the resistive circuit within the frequency detection circuit;
during a first phase of the XO, calibrating the auxiliary oscillator by utilizing the XO signal as a reference signal;
during the first phase, calibrating the resistive circuit by controlling the first impedance to make the detection voltage approach a reference voltage according to a comparison result of the detection voltage and the reference voltage;
during a second phase of the XO, calibrating the auxiliary oscillator to make a frequency of the driving signal to be a driving frequency which makes the detection voltage approach the reference voltage according to the comparison result of the detection voltage and the reference voltage; and injecting the driving signal having the driving frequency to the XO core circuit for accelerating the startup of the XO core circuit.

12. The method of claim 11, wherein the startup of the XO core circuit is performed without injecting the driving signal to the XO core circuit during the first powered on phase.

13. The method of claim 11, further comprising:
utilizing a comparator of the XO to compare the detection voltage with the reference voltage to generate the comparison result.

14. The method of claim 13, wherein calibrating the resistive circuit by controlling the first impedance to make the detection voltage approach the reference voltage during the first phase further comprises:
calibrating the resistive circuit by controlling the first impedance of the resistive circuit according to the comparison result during the first phase.

15. The method of claim 13, wherein calibrating the auxiliary oscillator to make the frequency of the driving signal to be the driving frequency which makes the detection voltage approach the reference voltage during the second powered on phase further comprises:
calibrating the auxiliary oscillator according to the comparison result during the second phase.

16. The method of claim 11, further comprising:
utilizing a divider of the XO to perform frequency division on the auxiliary signal to generate the driving signal.

17. The method of claim 11, wherein utilizing the frequency detection circuit to generate the detection voltage according to the driving signal associated with the auxiliary signal and the first impedance of the resistive circuit within the frequency detection circuit further comprises:

utilizing a switched-capacitor resistor within the frequency detection circuit to provide a second impedance according to the frequency of the driving signal; and generating the detection voltage according to the first impedance of the resistive circuit and the second impedance of the switched-capacitor resistor.

18. The method of claim 17, wherein the switched-capacitor resistor comprises a capacitor, a first switch and a second switch, the capacitor has first end coupled to a first reference terminal, the first switch is coupled between a second reference terminal and a second end of the capacitor, the second switch is coupled between the second end of the capacitor and the resistive circuit, and utilizing the switched-capacitor resistor within the frequency detection circuit to provide the second impedance according to the frequency of the driving signal further comprises:
utilizing two control signals generated according to the driving signal to control the first switch and the second switch, respectively.

19. The method of claim 11, wherein the resistive circuit comprises a resistor ladder.

20. The XO of claim 11, wherein the resistive circuit comprises a resistor, at least one switch coupled to the resistor and a mesh control circuit coupled to the at least one switch, and the method further comprises:
utilizing the mesh control circuit to generate at least one control signal to control a ratio of a time period of the at least one switch being turned on to a time period of the at least one switch being turned off, in order to determine the first impedance of the resistive circuit.

* * * * *